(12) United States Patent
Boeck et al.

(10) Patent No.: US 8,067,290 B2
(45) Date of Patent: Nov. 29, 2011

(54) BIPOLAR TRANSISTOR WITH BASE-COLLECTOR-ISOLATION WITHOUT DIELECTRIC

(75) Inventors: Josef Boeck, Munich (DE); Wolfgang Liebl, Bad Abbach (DE); Thomas Meister, Taufkirchen (DE); Herbert Schaefer, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 83 days.

(21) Appl. No.: 12/642,188

(22) Filed: Dec. 18, 2009

(65) Prior Publication Data

US 2010/0187657 A1 Jul. 29, 2010

Related U.S. Application Data

(60) Provisional application No. 61/147,589, filed on Jan. 27, 2009.

(51) Int. Cl.
*H01L 21/331* (2006.01)
(52) U.S. Cl. ............... 438/309; 438/336; 257/E29.174
(58) Field of Classification Search ........... 257/E29.174, 257/197; 438/202–208, 335, 336, 234–239, 438/309, 189
See application file for complete search history.

(56) References Cited

U.S. PATENT DOCUMENTS 7,071,500 B2 * 7/2006 Miura et al. ............... 257/197
2005/0212087 A1 9/2005 Akatsu et al.

\* cited by examiner

*Primary Examiner* — Evan Pert
*Assistant Examiner* — Selim Ahmed
(74) *Attorney, Agent, or Firm* — Eschweiler & Associates, LLC

(57) ABSTRACT

The disclosed invention provides a method for the fabrication of a bipolar transistor having a collector region comprised within a semiconductor body separated from an overlying base region by one or more isolation cavities (e.g., air gaps) filled with low permittivity gas. In particular, a multilayer base-collector dielectric film is deposited over the collector region. A base region is formed onto the multilayer dielectric film and is patterned to form one or more base connection regions. The multilayer dielectric film is selectively etched during a plurality of isotropic etch processes to allow for the formation of one or more isolation region between the base connection regions and the collector region, wherein the one or more isolation regions comprise cavities filled with a gas having a low dielectric constant (e.g., air). The resultant bipolar transistor has a reduced base-collector capacitance, thereby allowing for improved frequency properties (e.g., higher maximum frequency operation).

12 Claims, 7 Drawing Sheets

BIPOLAR TRANSISTOR WITH BASE-COLLECTOR-ISOLATION WITHOUT DIELECTRIC

FIELD OF INVENTION

The present invention relates generally to semiconductor device fabrication and more particularly to a method of forming a bipolar transistor with increased operating frequency.

BACKGROUND OF THE INVENTION

Bipolar transistors are generally constructed from two pn junctions lying close together in a semiconductor crystal. In different configurations, either two n-doped regions are separated from one another by a p-doped region (npn transistors) or two p-doped regions by an n-doped region (pnp transistors). The three differently doped regions are referred to as the emitter, the base, and the collector. Therefore, a bipolar transistor is essentially a three terminal device having three doped regions of alternating conductivity type.

Bipolar transistors exhibit desirable features such as high current gain and an extremely high cut-off frequency for switching applications, and high power gain and power density for microwave amplifier applications. These features make bipolar transistors important components in logic circuits, communications systems, and microwave devices.

As with other types of semiconductor devices, there is a demand for bipolar transistors having increasingly higher operating frequencies and/or switching speeds. Since their invention in 1947, many attempts have been made to meet these demands and improve the performance of such transistors with respect to their speed, power, and frequency characteristics. These attempts have focused on making devices better suited for high speed applications such as microwave and logic devices. One particular way to meet, these demands for higher frequency operation is to provide a device with a lower base resistance and base-collector junction capacitance.

In the case of bipolar transistors, the base-collector capacitance is one of the decisive transistor parameters which determine important characteristic quantities of the bipolar transistor such as the maximum oscillation frequency. The extrinsic base resistance corresponds to the resistance between the base, or the actual base area, and an external contact, which is connected to the base via a connecting line.

Accordingly, for example, the upper limit for application frequency of a bipolar transistor (e.g., heterojunction bipolar transistor) can be approximated as:

$$F_{max} = \sqrt{\frac{f_T}{8\pi \cdot R_B \cdot C_{BC}}}$$

where $f_{max}$ designates the maximum oscillation frequency, $f_T$ designates the transition frequency, $R_B$ designates the base resistance, and $C_{BC}$ designates the base-collector capacitance. The transition frequency, $f_T$, is essentially determined by the dopant profile in the active transistor region while the product of $R_B \cdot C_{BC}$ can be influenced by the transistor layout (i.e., the geometrical construction).

Depending on the transistor configuration and materials used (e.g., silicon oxide, silicon nitride, carbon layers, metal oxides), the base-collector capacitance can have different structures and spread. The most significant contribution to the capacitance is due to the dielectrics used. In general the total base-collector capacitance has three components. More particularly, the total base-collector capacitance of the bipolar transistor is the sum of the capacitance in the active base silicon region and the parasitic capacitances occurring between the base connection areas and collector due to the dielectric between them.

This total base-collector capacitance can be written:

$$C_{BC,total} = C_{BC,active} + C_{BC,dielectric,1} + C_{BC,dielectric,2}$$

Therefore, the total base-collector capacitance ($C_{CB,total}$) comprises an active capacitive component ($C_{BC,active}$) due to the doping profile in the active device (between the emitter and the active collector region), a first dielectric component ($C_{BC,dielectric,1}$) due to the capacitance of the dielectric layer comprised between the base connection region and the collector region, and a second dielectric component ($C_{BC,dielectric,2}$) also due to the capacitance of the dielectric layer comprised between the base connection region and the collector region.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The present invention relates to a method of fabricating a bipolar transistor to have one or more isolation cavities (e.g., air gaps) which reduce the devices base-collector capacitance, thereby allowing for improved frequency properties (e.g., higher maximum frequency operation). More particularly, the disclosed method provides for the fabrication of a bipolar transistor having a collector region (e.g., comprising a collector or collector connection region) comprised within a semiconductor body and an overlying base region (e.g., comprising a base or base connection region). One or more isolation cavities (e.g., air gaps) are formed between the base or base connection region and the collector or collector connection region, wherein the one or more isolation cavities comprise cavities filled with a gas having a low dielectric constant (e.g., air).

Essentially, a multilayer base-collector dielectric film is deposited over an active collector region comprised within a semiconductor body. One or more base connection regions are formed onto the multilayer dielectric film. The multilayer dielectric film is then selectively etched to allow for the formation of selective base connections below the base connection regions. The selective base connections have a thickness less than the etched thickness, thereby resulting in a space below the selective base connections. Subsequent selective etches additionally remove the multilayer dielectric film exposed below the selective base connection, thereby opening a cavity beyond the selective base connection regions and below the base connection regions. A selective epitaxial growth is then performed to form an active base region in the cavities. During the epitaxial growth the space below the selective base connections will close thereby preserving the one or more isolation cavities below the one or more base connection regions (i.e., preventing the cavities from filling in). Once the active base region is grown an emitter can be formed over the active base region. Therefore, the disclosed method allows for the formation of air filled isolation cavities utilizing a method that is compatible with presently used fabrication process sequences.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
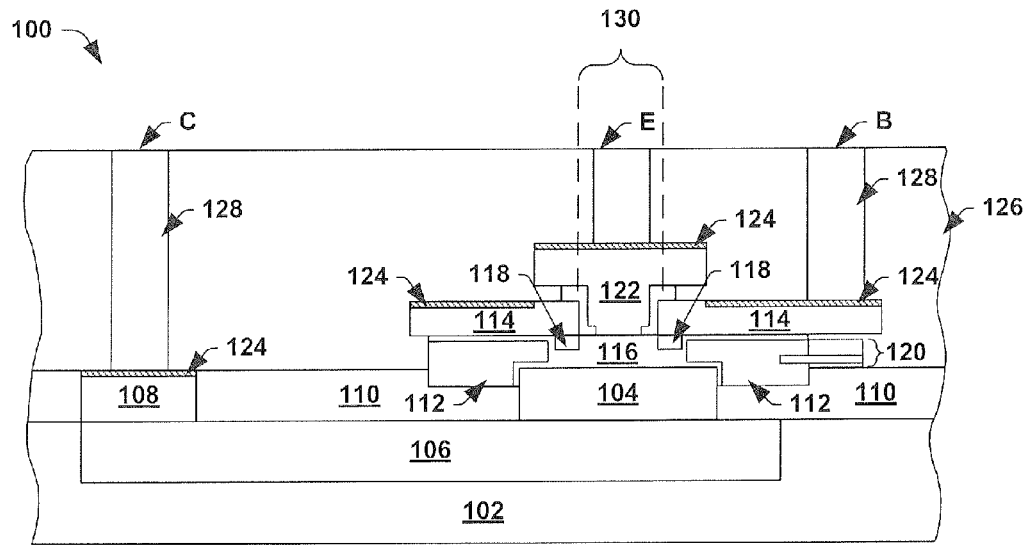
FIG. 1 illustrates a cross sectional view of a bipolar transistor according to the present invention, wherein isolation cavities comprising a low permittivity gas are configured between a base or base connection region and a collector or collector connection region.

The present invention will now be described with reference to the attached drawing figures, wherein like reference numerals are used to refer to like elements throughout, and wherein the illustrated structures and devices are not necessarily drawn to scale.

As transistors scale to smaller and smaller sizes, the area related device capacitances across respective device dielectric layers become larger and larger. This increase in device capacitance is due to the vertical down-scaling of the dielectric layer thickness generally associated with the lateral down-scaling of device components, since capacitance is inversely proportional to the thickness of the dielectric (i.e., capacitance~$1/t_{dielectric}$). Therefore, as scaling continues, these capacitances (i.e., parasitic capacitances) will increasingly dominate device performance and in this way represent a significant limitation to the high frequency properties of bipolar transistors and their future improvements.

In particular, the total base-collector capacitance of a bipolar transistor is very important in determining important characteristic quantities such as the maximum oscillation frequency. The most significant contribution to the base-collector capacitance is due to the dielectric layers used to separate the base and collector regions of a device (i.e., dielectric layers configured between the base and collector connection regions). The dielectric layers typically used today have a relatively high permittivity. For example, silicon oxide has a permittivity of 3.9, silicon nitride 7.5, aluminum oxide 11. These high permittivity dielectric layers result in a relatively large base-collector capacitance resulting in limited high frequency properties. Therefore, there is a need for a bipolar transistors having a reduced base-collector capacitance.

Accordingly, the present invention relates to a bipolar transistor comprising one or more isolation cavities (e.g., air gaps) which reduce the devices base-collector capacitance and a process for fabricating the transistors provided herein. More particularly, the bipolar transistor provided herein is configured to have one or more isolation cavities (e.g., air gaps) configured between a base region (e.g., comprising an active base region and a base connection regions) and a collector region (e.g., comprising an active collector region, a buried layer, and a collector connection region). The isolation cavities comprise a gas (i.e., gaseous state of matter) having a low dielectric constant (e.g., air, nitrogen, etc.). Therefore, in the bipolar transistors provided herein, dielectric materials (e.g., silicon oxide, silicon nitride, aluminum oxide) that are presently used in state of the art bipolar devices to isolate the base region from the collector region are replaced by one or more isolation cavities filled with a gas having a low dielectric constant. The low permittivity isolation cavities reduce the base-collector capacitance, thereby allowing for improved frequency properties (e.g., higher maximum frequency operation).

For example, FIG. 1 illustrates a cross sectional view of one embodiment of a bipolar transistor 100 according to the present invention. The bipolar transistor 100 comprises a collector region (C), a base region (B), and an emitter region (E). In one embodiment, the bipolar device comprises a silicon germanium heterojunction bipolar transistor, wherein the collector is formed in a silicon substrate and the epitaxially grown base layer comprises a silicon germanium layer.

As shown in FIG. 1, the collector region (C) has a first conductivity type (e.g., n-type) and is formed in a semiconductor body 102. More particularly, the collector comprises an active collector region 104 coupled to a collector connection region 108 by way of a low resistance doped buried silicon layer 106. The active collector region 104 is often formed of a monocrystalline silicon substrate and can, for example, be made from silicon epitaxial layers. The components of the collector are generally isolated by means of one or more lateral isolation regions 110 (i.e., field oxide regions). In one embodiment, the field oxide regions 110 may comprise a shallow trench isolation (STI) filled with a dielectric (e.g., silicon oxide).

The base region (B) has a second conductivity type (e.g., p-type) and comprises an active base region 116, one or more highly doped selective base connection regions 118, and one or more base connection regions 114. The one or more base connection regions 114 are used to connect the active base region 116 to metal interconnect wires (not shown) by way a contact 128. The base connection regions 114 are configured to allow an opening 130 (emitter window) defining the emitter region of the transistor. During subsequent processing, formation of the active base region 116 and the emitter region 122 is performed in the emitter window 130.

In one embodiment, the active base region 116 comprises an epitaxially grown silicon material and is formed to a concentration on the order of 1e19 cm$^3$. The one or more selective base connection regions 118 electrically couple the active base region 116 to the one or more base connection regions 114. The one or more selective base connection regions 118 comprise a highly doped epitaxially grown material. The one or more selective base connection regions 118 are doped higher than the active base region 116, thereby providing a low resistance contact between the base connection regions 114 and the active base region 116. In one embodiment, the one or more selective base connection regions 118 are doped to a concentration of greater than 1e20 cm$^3$, thereby forming a particularly low base connection resistance.

Furthermore, it will be appreciated that the active base region 116 is formed to have a small thickness (e.g., much less than the diffusion length of the electrons), so that carriers can diffuse across it in much less time than the semiconductor's minority carrier lifetime, to minimize the percentage of carriers that recombine before reaching the collector-base junction.

One or more isolation cavities 112 are configured between the active collector region 104 and the base connection regions 114. As illustrated in FIG. 1, the one or more isolation cavities 112 allow for the active base region 116 to be configured in the emitter window 130 and to form an electrical connection between the base connection regions 114 (via highly doped selective base connection regions 118) and the active collector region 104. The one or more isolation cavities 112 are filled with a gas having a low dielectric constant, thereby reducing the capacitance between the base connection regions 114 and the active collector regions 104. In one embodiment, the gas may comprise air having a permittivity of 1.

In one embodiment, the remnants of a multilayer dielectric film are visible in a cross sectional view of the bipolar device, as shown in FIG. 1. As will be more fully appreciated below, during device fabrication a multilayer dielectric film is configured between the base region (e.g., base connection regions) and the collector region and is selectively etched. In some embodiments, a remnant of the multilayer dielectric film may remain in the bipolar transistor cross section after the device is fabricated, thereby providing evidence of the use of the method provided below. As shown in FIG. 1, the multilayer dielectric film is illustrated by element 120, wherein the multilayer dielectric film may comprise a plurality of dielectric layers. In one embodiment, the multilayer dielectric film 120 comprises three stacked dielectric layers, wherein the top and the bottom dielectric layers are formed from the same dielectric material (e.g., silicon oxide) and the middle dielectric layer is formed from a different dielectric material (e.g., silicon nitride).

In another embodiment, to reduce the connection resistance, the collector, base, and emitter connection regions can be siliconized with a thin silicide layer 124. Finally, a dielectric layer 126 is configured above the semiconductor body 102. Contact holes are formed in the dielectric layer 126 and then are filled with metal (e.g., W) to form contacts 128 extending from the connection regions (e.g., 108, 114, 122) to back end of the line interconnect metal layers.

Figure 2:
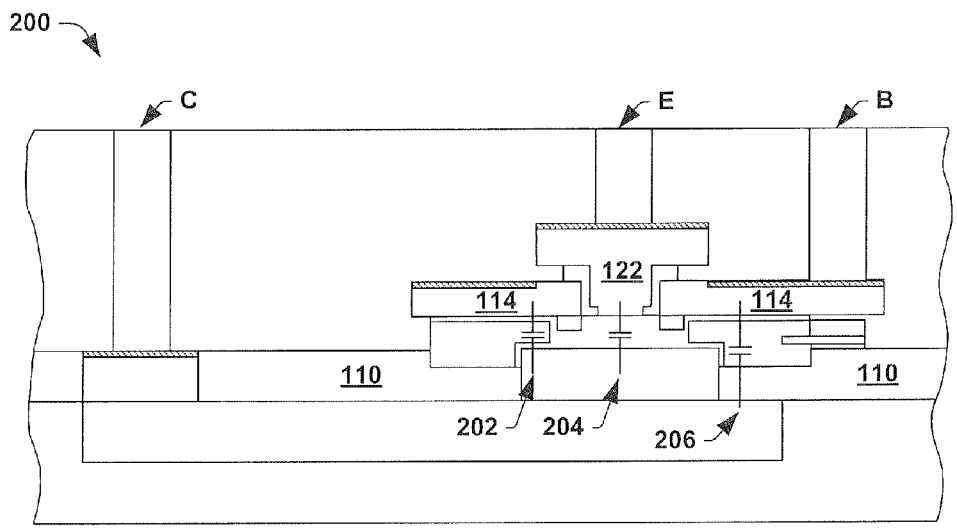
FIG. 2 illustrates a schematic diagram of the base-collector capacitances of the disclosed bipolar transistor provided in FIG. 1.

FIG. 2 shows a schematic diagram 200 illustrating the components of the base-collector capacitance of the bipolar transistor shown in FIG. 1. As illustrated in FIG. 2, the total base-collector capacitance comprises an active component ($C_{BC,active}$) (illustrated as capacitor 204) between the emitter region 122 and the active collector region 104, a first dielectric component ($C_{BC,dielectric,1}$) (illustrated as capacitor 202) due to capacitance between the base connection region 114 and the collector region, and a second dielectric component ($C_{BC,dielectric,2}$) (illustrated as capacitor 206) also due to the capacitance between the base connection region 114 and the collector region (i.e., the dielectric between the base connection region 114 and the doped buried silicon layer 106). The capacitances between the base connection regions 114 and the active collector regions (illustrated as capacitors 202 and 206) will be reduced in comparison to a state of the art device, since the dielectric material present in a state of the art device (e.g., having a permittivity of 7.5) is replaced with an isolation cavity comprising a gas having a lower permittivity (e.g., having a permittivity of 1). Therefore, the overall base-collector capacitance of the device shown in FIG. 1 will be reduced in comparison to the state of the art device, resulting in a device with improved high frequency properties.

Figure 3:
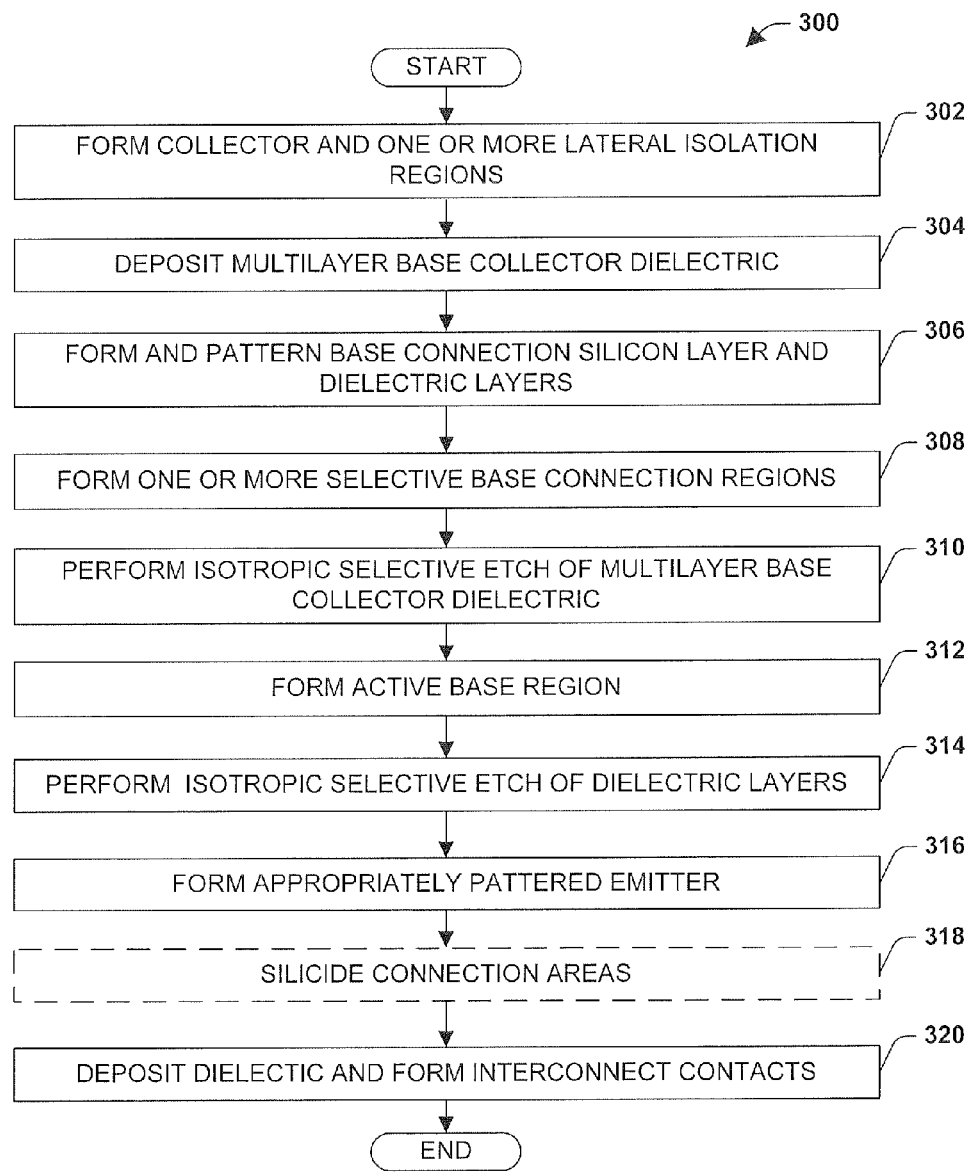
FIG. 3 shows a flow diagram illustrating an exemplary methodology for forming a reduced capacitance bipolar transistor.

FIG. 3 illustrates a method of fabricating a bipolar transistor having a reduced base-collector capacitance. In particular, the method of FIG. 3 provides for the fabrication of a bipolar transistor having one or more isolation cavities formed between a base or base connection regions and a collector or collector connection regions, wherein the one or more isolation cavities comprise cavities filled with a gas having a low dielectric constant (e.g., air). The method relies upon the deposition of a multilayer base-collector dielectric film over an active collector region. Selective etching of respective layers of the multilayer dielectric film allows for the formation of an isolation cavity and for subsequent epitaxial growth of an active base region within the cavity, without destroying the cavities between the base and the collector regions.

While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, it will be appreciated that the one or more isolation cavities are formed by processing methods which are compatible with presently used technologies, and which result in only minor modifications to the current process sequence.

Figure 4:
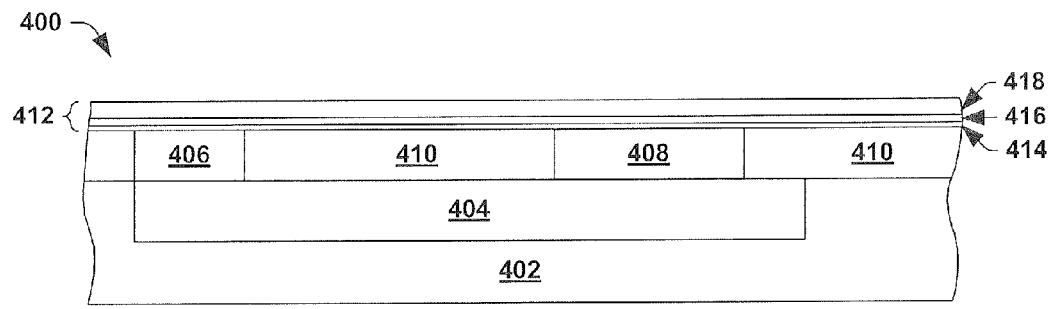
FIG. 4-15 illustrate cross sectional views of a bipolar transistor as formed according to the method of FIG. 3.

At 302 the collector and one or more lateral isolation region(s) are formed. As illustrated in FIG. 4, the collector is formed in or on a semiconductor body 402 and may comprise a low resistance buried layer 404, a collector connection region 406, and an active collector region 408. One or more lateral isolation regions 410 (i.e., field oxide regions) abut the periphery of the active collector region 408 and are configured to provide electrical isolation between the collector connection region 406 and the active collector region 408. In one embodiment, the one or more lateral isolation regions 410 may comprise shallow trench isolations (STI) regions formed by etching trenches in the semiconductor body 402, filing the trenches with an oxide, and planarizing the semiconductor body 402 with chemical mechanical polishing.

The buried layer 404 is formed within the semiconductor body 402. In one embodiment, the buried layer 404 is formed by an initial implantation followed by an inward diffusion. In an alternative embodiment, the buried layer 404 is formed by a high energy implantation. The collector connection region 406 may similarly be formed by an implantation. In one embodiment, the active collector region 408 is formed by an epitaxial growth onto the underlying semiconductor body 402. In an alternative embodiment, where the buried layer 404 is formed sufficiently deep into the semiconductor body 402, the active collector region 408 can be formed by implantation of the semiconductor body 402.

A multilayer base-collector dielectric film is deposited overlying the collector region at 304. The multilayer base-collector dielectric film is deposited above the active collector region, the collector connection region, and the one or more lateral isolation regions. The multilayer dielectric film comprises a plurality of separate dielectric layers, respectively selected such that they can be selectively etched isotropically in regard to each other (i.e., one layer can be selectively etched without damaging an adjacent layer). Furthermore, in one particular embodiment the multilayer dielectric film is deposited to a composite thickness equal to that of a single base-collector dielectric layer used in a state of the art bipolar transistor, thereby not requiring any adaptations to be made to already existing processes due to an altered topography on the wafers.

The use of a multilayer dielectric film is advantageous for fabrication of a bipolar transistor having one or more isolation cavities, because the possibility of selective isotropic etches makes transistor fabrication easy. However, it will be appreciated that although a multilayer film is used for fabrication of a bipolar transistor in method 300 and its associated figures (FIG. 4-16), in alternative embodiments, such a transistor (having one or more isolation cavities) can also be fabricated with a single layer base-collector dielectric film.

FIG. 4 illustrates one embodiment of the present invention wherein the multilayer base-collector dielectric film 412 comprises a stacked structure of three dielectric layers (e.g., 414, 416, 418). As shown in FIG. 4, a first dielectric layer 414, comprised of a first type of dielectric material, is formed overlying the active collector region 408, the collector connection region 406, and the one or more lateral isolation regions 410. A second dielectric layer 416, comprised of a second type of dielectric material, is formed overlying the first dielectric layer 414. And a third dielectric layer 418, comprised of the first type of dielectric material, is formed overlying the second dielectric layer 416. Therefore, as shown in FIG. 4, the multilayer dielectric film 412 is comprised of three layers, wherein two of the layers comprises a same type of dielectric material.

In one particular embodiment, the first type of dielectric material (e.g., layer 414 and 418) is silicon oxide and the second type of dielectric material (e.g., layer 416) is silicon nitride. Such an embodiment offers an advantage that the silicon nitride layer, which can cause crystalline faults in the silicon, is not in direct contact with silicon.

At 306 a base connection silicon layer and one or more overlying dielectric layers are formed and patterned. The base connection silicon layer comprises a highly doped silicon layer and is formed over the multilayer dielectric film. The high doping can be achieved by implantation. In one embodiment, the base connection silicon layer comprises a doped polysilicon layer. Above the base connection silicon layer one or more dielectric layers are formed. The stacked silicon and dielectric layers are patterned according to photolithography techniques well known in the art (e.g., patterned using a photoresist material which is exposed to define a pattern) to form one or more base connection regions. The patterning specifically allows for the formation of an opening for subsequent formation of an active base region and an emitter region.

Figure 5:
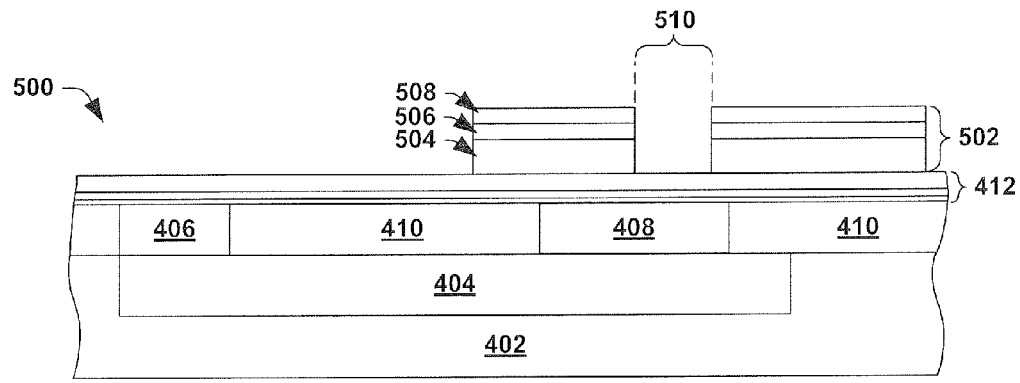

FIG. 5 illustrates a cross section according to the present invention comprising a patterned base connection silicon 504 (i.e., one or more base connection regions) and overlying dielectric layers 506 and 508. As shown in FIG. 5, a highly doped base connection silicon layer 504 is deposited onto the multilayer base-collector dielectric film 412. A first type of dielectric material 506 (e.g., silicon oxide) is then formed above the highly doped base connection silicon 504, followed by a second type of dielectric material 508 (e.g., silicon nitride) formed above the first type of dielectric material 506. The stack of materials 502 (comprising the highly doped base connection silicon, the first and second types of dielectric material) are selectively patterned allowing an opening 510 (emitter window) for subsequent formation of an active base region and an emitter region.

Figure 6:
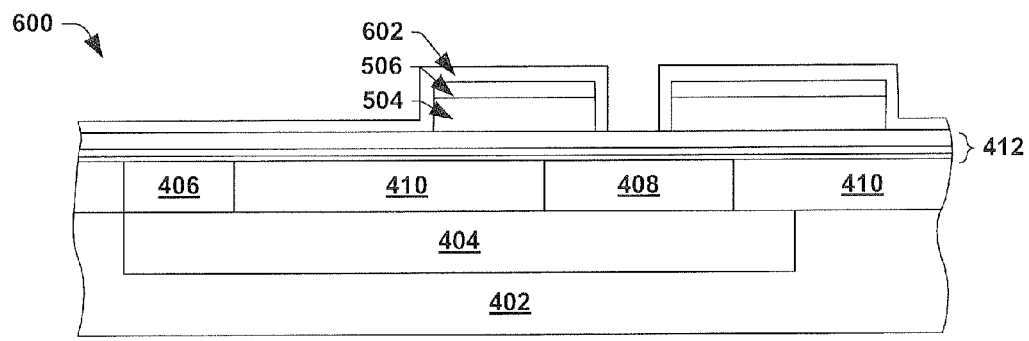

FIG. 6 illustrates an additional embodiment, wherein an additional layer of the second type of dielectric material 602 is deposited to cover the semiconductor body 402 in a manner which overlies dielectric layer 508. This additional layer of dielectric material 602 is patterned to provide a protective layer that covers the transistor (except for the not yet formed emitter region) from subsequent isotropic etching. The dielectric 602 also can act as a base-emitter dielectric spacer. In alternative embodiments, different materials can be used for the transistor cover and the spacer.

One or more selective base connection regions are formed at 308. Formation of the selective base connection regions is performed by etching away the top layer of the multilayer dielectric film to form an undercut area below the base connection silicon layer. Since the multilayer dielectric film allows for selective etching the top layer can be removed without damaging the underlying layer and exposing the active collector region. Selective epitaxy is then carried out to form one or more selective base connection regions in the undercut area abutting the underside of the one or more base connection regions. The one or more selective base connection regions are formed to a thickness that is less than that of the top layer of the multilayer dielectric film. This provides for a spacing between the one or more selective base connection regions and the underlying multilayer dielectric film.

Figure 7:
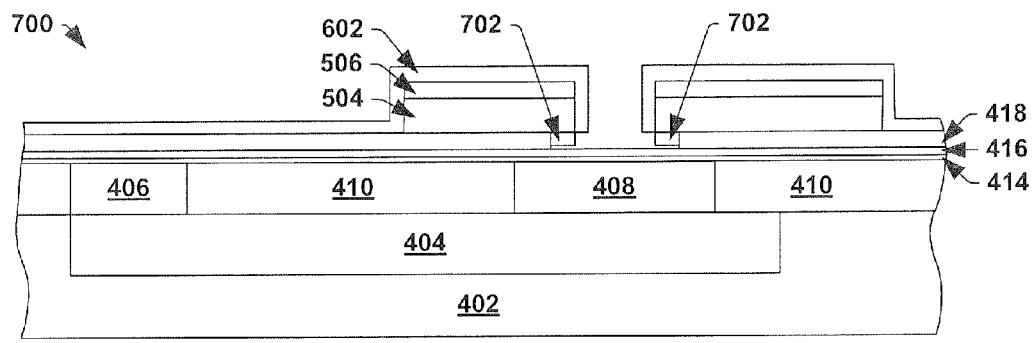

The formation of the one or more selective base connection regions is more readily understood in conjunction with FIG. 7. FIG. 7 shows a cross sectional view illustrating the formation of one or more selective base connection regions 702. The top layer 418 of the multilayer dielectric film 412 is selectively etched so that a small projection of the base connection silicon 504 (i.e., base connection regions) occurs. The selective base connection regions 702 are then formed under the exposed part of the base connection silicon 504, and not on the underlying multilayer dielectric film 412 (specifically, the second dielectric layer 416). Therefore, the selective base connection regions 702 are formed to a thickness smaller than the top layer 418 of the multilayer dielectric film 412. This prevents a connection between the multilayer dielectric film 412 (specifically, the second dielectric layer 416) and the selective base connection 702, thereby allowing for subsequent etching under the base connection silicon 504 (i.e., etchants can access the region underneath the base connection regions using the small space below the selective base connection regions 702). The selective base connection regions 702 can be doped to any extent. In one embodiment, the selective base connection regions 702 are doped to a concentration of greater than $1e20$ $cm^3$ forming a particularly low base connection resistance. Such high doping concentration provides an advantage over traditional base regions which are formed from a single deposition having a considerably lower concentration (e.g., no more than several $1e19$ $cm^3$) than would be possible in silicon.

At 310 the multilayer base-collector dielectric is selectively isotropically etched. Selective isotropic etching is performed to form one or more cavities configured below the base connection regions. An etchant acts on the material below the base connection silicon through the small space below the selective base connection regions and etches a cavity beyond that region.

Figure 8:
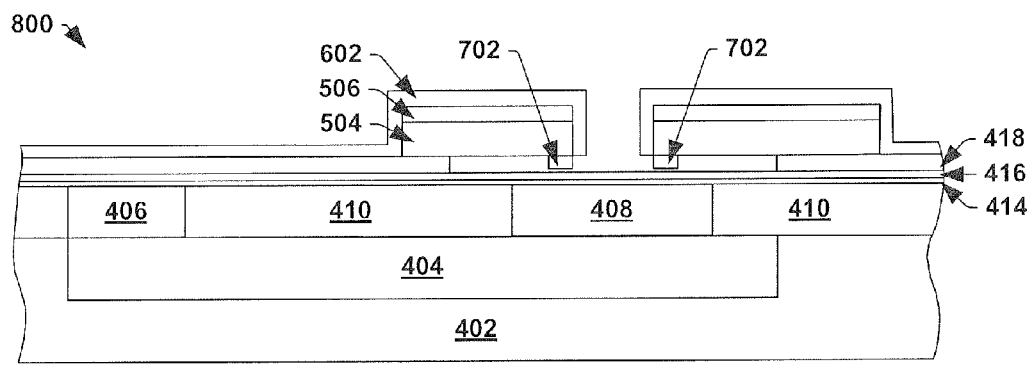
Figure 9:
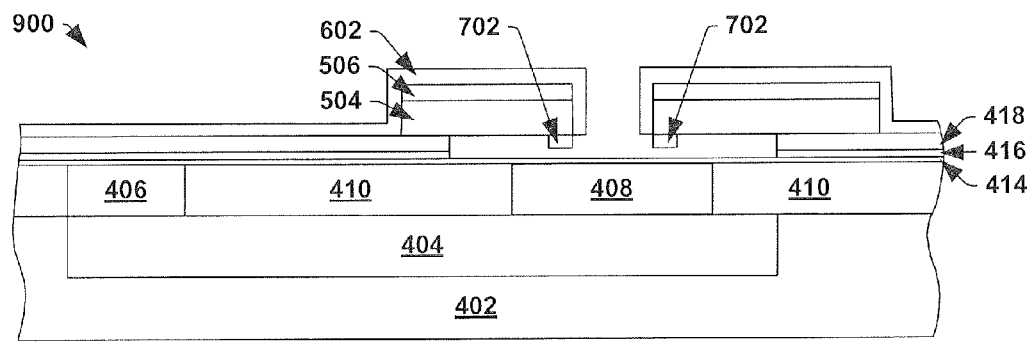
Figure 10:
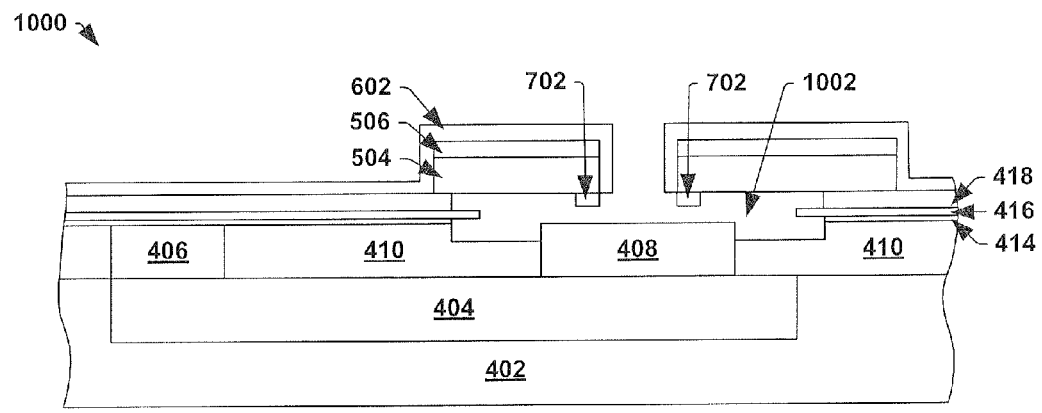

In one particular embodiment, the selective etching of the multilayer base-collector dielectric is performed according to a plurality of actions, as shown in FIGS. 8-10. In FIG. 8 the third dielectric layer 418, comprising a first type of dielectric material, is selectively etched in regard to the second dielectric layer 416, comprising a second type of dielectric material. In one embodiment, the base connection silicon 504 is only partially undercut by this etch, thereby allowing for further undercutting to occur in subsequent etching processes. In an embodiment wherein the first dielectric type comprises silicon oxide, the etchant can comprise hydrofluoric acid.

In FIG. 9, a short isotropic etch is performed to remove part of the second dielectric layer 416 thereby exposing the first dielectric layer 414, but still covering the active collector region 408 and the one or more lateral isolation regions 410. Additionally the spacer 602 in the emitter window is not removed, but only thinned. In one embodiment, wherein the second dielectric type 416 comprises silicon nitride, the etchant can comprise phosphoric acid.

Finally, in FIG. 10 an isotropic etch of the first dielectric layer 414 is performed. The selective etch undercuts (e.g., fully undercuts, partially undercuts) the base connection silicon 504 and in addition removes some of the one or more lateral isolation regions 410 (e.g., shallow trench isolation regions). This etch forms a single large cavity 1002 extending below both base connection regions 504 and open at the emitter window. The etch time can be adjusted to form a cavity 1002 having a different size as desired.

An active base region is formed at 312. The active base region is formed by a selective epitaxy which forms the active base region in the emitter window and which breaks the single large cavity into one or more isolation cavities. Since the height of the opening under the selective base connection regions is smaller than the height of the one or more cavities the epitaxy will plug the opening to the one or more isolation cavities, thereby closing the one or more isolation cavities from external contact.

Figure 11:
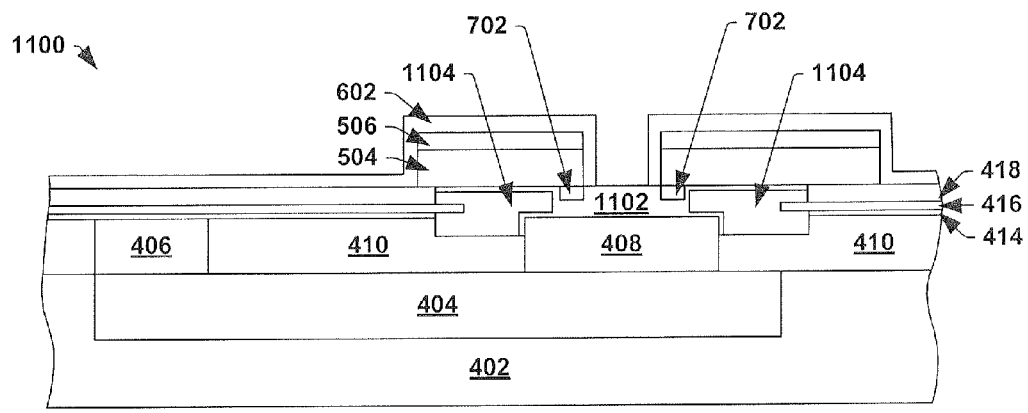

FIG. 11 shows a cross sectional view illustrating the formation of the active base region 1102. The selective deposition initially takes place on all exposed surfaces. In the area under the selective base connection 702, the active base region 1102 grows from above. In the area above the active collector region 408, the active base region 1102 grows from below. Once the two growth fronts (i.e., from the selective base connections 702 and the active collector region 408) make contact, one or more separate isolation cavities 1104 are formed under respective base connection silicon regions 504 and are sealed, thereby preventing further growth in respective cavities isolation 1104.

At 314 the dielectric layers are selectively etched. An isotropic selective etch is used to remove the second type of dielectric material in regard to the first type of dielectric material and silicon.

Figure 12:
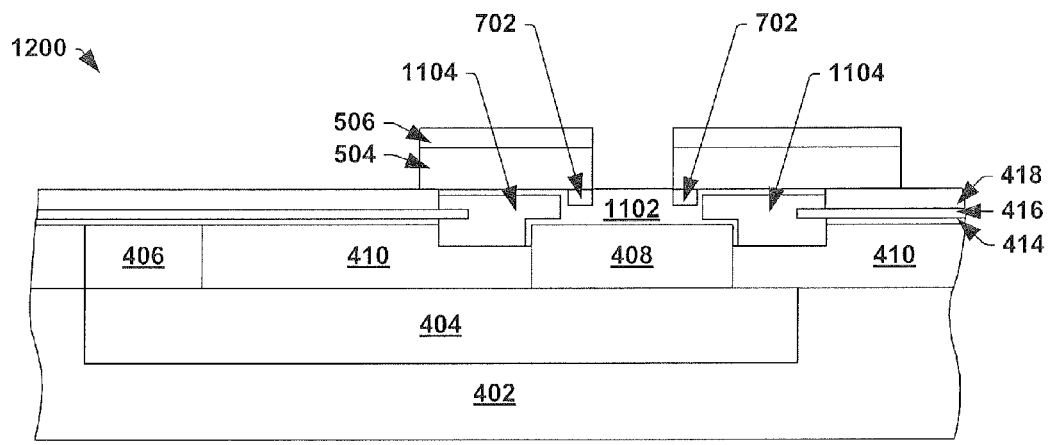

FIG. 12 illustrates a cross section according to the present invention, wherein the dielectric layers (e.g., 602) are selectively etched to remove all but dielectric 506.

An appropriately patterned emitter region is formed at 316. The emitter region is formed to overlap the base region and comprises a semiconductor material having the same conductivity type as the collector region. In one embodiment, an emitter silicon is formed over the surface of the substrate and then is selectively patterned to define an emitter region for the device. In an additional embodiment, an emitter-base spacer is formed on the base region prior to the formation of the emitter region.

Figure 13:
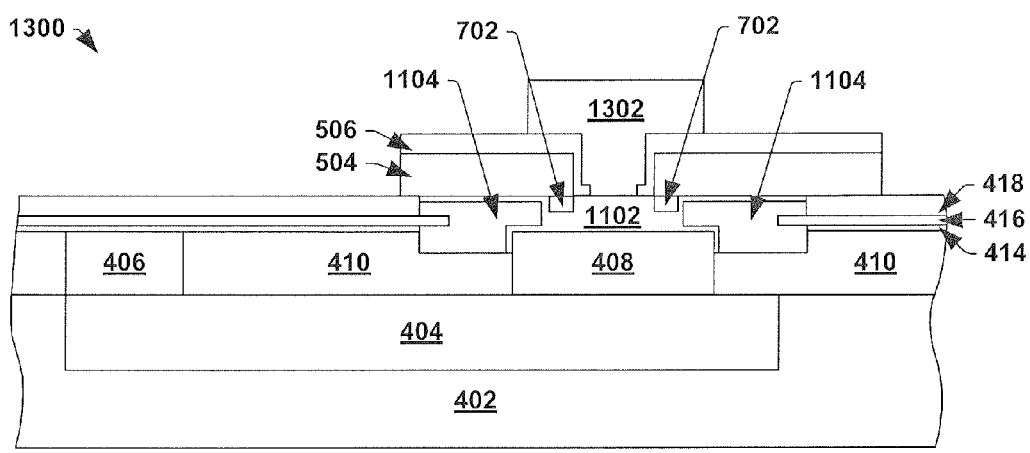

FIG. 13 illustrates a cross section according to the present invention wherein an emitter 1302 is formed. The emitter is formed in the emitter window and is separated from the base connection regions 504 by an extended dielectric layer 506.

The connection regions are optionally silicided at 318. Silicidation forms a low resistance silicide (e.g., Titanium silicide) on the surface of the connection regions thereby providing a lower resistance connection. In one embodiment, silicidation can be performed by first etching the dielectric layers overlying the connection regions. In one embodiment, the etch is performed anisotropically with a reactive ion etch (RIE), thereby removing all dielectrics at the same time. In an alternative embodiment, a wet etchant is used. A metal is then deposited (e.g., sputtered) onto the surface of the connection silicon regions (the collector, base, and emitter connection silicon regions). A high temperature anneal is then performed resulting in a reaction between the metal layer and the underlying silicon which forms a low resistance silicide. The remaining metal which has not reacted is removed.

Figure 14:
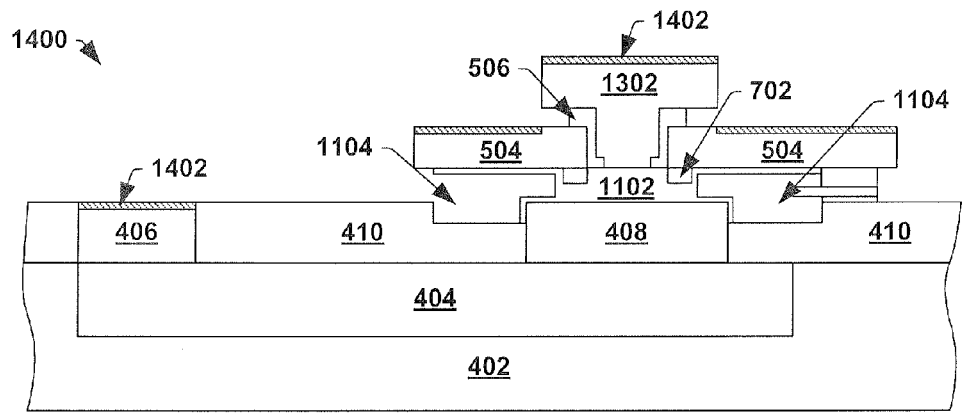

FIG. 14 illustrates a cross section of an embodiment wherein a silicide 1402 is formed onto the upper surface of the connection regions. In particular, a silicide 1402 (e.g., titanium silicide) is formed onto the collector connection region 406, the base connection regions 504, and the emitter 1302.

An inter-level dielectric is formed and contacts are formed within the inter-level dielectric at 320. The inter-level dielectric (ILD) material layer (e.g., silicon oxide, fluorinated silicon oxide, polymers including polyimide and fluorinated polyimide, ceramics, carbon and other dielectric materials) is deposited above the semiconductor body. Holes (i.e., contact holes) are patterned using known techniques such as the use of a photoresist material which is exposed to define a pattern. After developing, the photoresist acts as a mask through which the pattern of the ILD material is removed by a subtractive etch process (e.g., such as plasma etching or reactive ion etching) to form the contact holes. The contact holes are then filled a single metal deposition step to form a contact level. Metal may be deposited using a filling technique such as electroplating, electroless plating, chemical vapor deposition, physical vapor deposition or a combination of methods. This process may further include planarization of the metal by removing excess material with a method such as chemical mechanical polishing.

Figure 15:
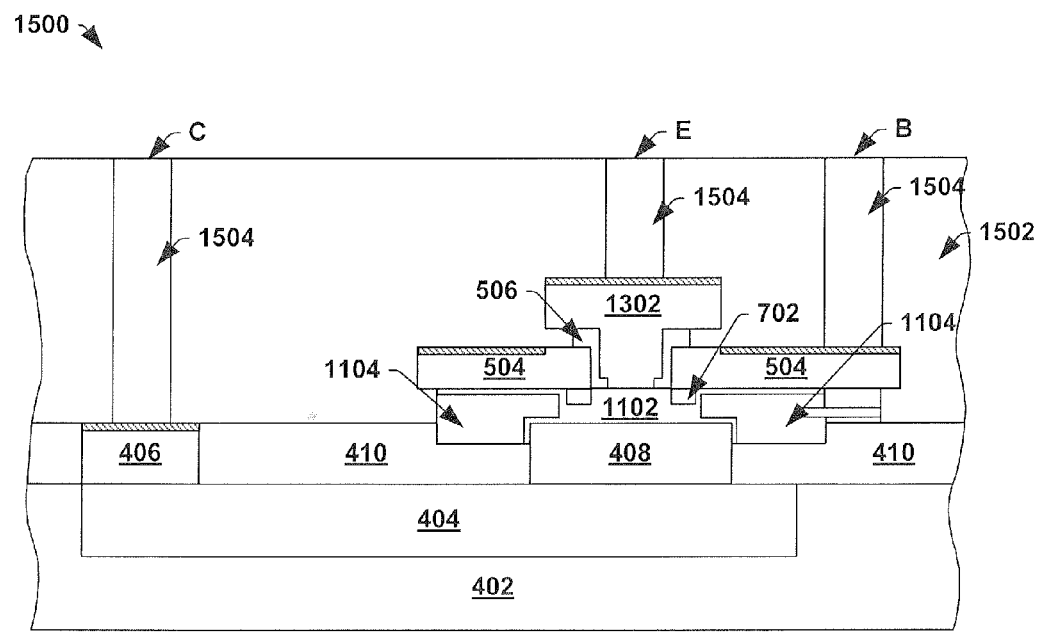

FIG. 15 illustrates a cross section of a bipolar device fabricated according to the method of FIG. 3. In particular, FIG. 15 illustrates an inter-level dielectric layer 1502 formed onto the semiconductor body 402. Contacts 1504 are formed within the inter-level dielectric layer 1502 and connect each of the connection regions (i.e., the collector connection region 406, the base connection regions 504, and the emitter 1302) to overlying interconnect metal layers (not shown).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for forming a bipolar transistor within a semiconductor body having a reduced base-collector capacitance, comprising:

forming a collector region comprising an active collector region and having a first conductivity type;

forming a base-collector dielectric film above the collector region;

forming one or more base connection regions overlying the base-collector dielectric film, the one or more base connection regions having an opposite conductivity type as the collector region;

selectively etching the base-collector dielectric film to form an undercut area below an edge of respective base connection regions;

forming one or more selective base connection regions in the undercut area, the one or more selective base connection regions having a thickness less than the undercut area;

selectively isotropically etching the base-collector dielectric film to form a large cavity configured between the one or more base connection regions and the collector region;

selectively forming an active base region in the large cavity electrically coupling the one or more base connection regions and the collector region, wherein selectively forming the active base region separates the large cavity into one or more gas filled isolation cavities configured between the one or more base connection regions and the collector region; and forming an appropriately patterned emitter region, having the same conductivity type as the collector region, overlying the active base region.

2. The method of claim 1, wherein the active collector region is epitaxially grown onto the semiconductor body.

3. The method of claim 1, wherein forming the one or more base connection regions comprises:
depositing a polysilicon layer;
depositing a first type of dielectric material overlying the polysilicon layer;
depositing a second type of dielectric material overlying the first type of dielectric material; and
selectively patterning the polysilicon layer, the first type of dielectric material, and the second type of dielectric material to form the one or more base connection regions.

4. The method of claim 1, further comprising forming one or more lateral isolation regions configured around the active collector region.

5. The method of claim 4, wherein forming the collector region further comprises:
forming a collector connection region laterally separated from the active collector region by the one or more lateral isolation regions; and
implanting a low resistance buried layer within the semiconductor body, the low resistance buried layer configured to electrically couple the active collector region to the collector connection region.

6. The method of claim 5, further comprising:
depositing a metal film over the semiconductor body; and
annealing and selectively etching the metal film to form low resistance silicide layers over the collector connection region, the appropriately patterned emitter region and the one or more base connection regions.

7. The method of claim 1, wherein the base-collector dielectric film comprises a multilayer base-collector dielectric film.

8. The method of claim 7, wherein forming the multilayer base-collector dielectric film comprises:
forming a first dielectric layer comprising a first dielectric type overlying the active base region;
forming a second dielectric layer comprising a second dielectric type overlying the first dielectric layer; and
forming a third dielectric layer comprising the first dielectric type overlying the second dielectric layer.

9. The method of claim 8, wherein the first dielectric type is a silicon oxide and the second dielectric type is a silicon nitride.

10. The method of claim 8, wherein forming the one or more selective base connection regions comprises:
selectively etching the third dielectric layer to expose a small projection of respective base connection regions; and
epitaxially growing the one or more selective base connection regions onto respective base connection regions to a thickness smaller than that of the third dielectric layer.

11. The method of claim 8, wherein selectively isotropically etching the multilayer base-collector dielectric film comprises:
selectively etching the first dielectric layer to partially undercut respective base connection regions;
selectively etching the second dielectric layer to further undercut the respective base connection regions; and
selectively etching the first dielectric layer to further undercut the respective base connection regions and to remove a part of respective lateral isolation regions.

12. The method of claim 5, further comprising:
depositing a inter-level dielectric layer above the semiconductor body;
selectively patterning and etching the inter-level dielectric layer to form contact holes extending from the top of the inter-level dielectric layer to the emitter, collector connection region, and base connection regions; and
depositing a metal to fill the contact holes.

* * * * *